United States Patent [19]

Dennard

[11] Patent Number: 5,378,943
[45] Date of Patent: Jan. 3, 1995

[54] LOW POWER INTERFACE CIRCUIT

[75] Inventor: Robert H. Dennard, New Rochelle, N.Y.

[73] Assignee: International Business Machines Corporation, Armonk, N.Y.

[21] Appl. No.: 49,912

[22] Filed: Apr. 20, 1993

[51] Int. Cl.[6] .......................................... H03K 19/094
[52] U.S. Cl. ..................... 326/68; 326/121; 327/530
[58] Field of Search ............. 307/443, 451, 475, 296.1

[56] References Cited

U.S. PATENT DOCUMENTS

| | | | |
|---|---|---|---|
| 4,786,830 | 11/1988 | Foss ...................... | 307/475 |
| 4,825,106 | 4/1989 | Tipon et al. .............. | 307/443 X |
| 4,857,763 | 8/1989 | Sakurai et al. ............ | 307/443 |
| 4,859,870 | 8/1989 | Wong et al. .............. | 307/443 X |
| 4,929,853 | 5/1990 | Kim et al. ................ | 307/475 |
| 5,087,841 | 2/1992 | Rogers .................... | 307/475 |
| 5,151,620 | 9/1992 | Lin ....................... | 307/451 X |
| 5,160,855 | 11/1992 | Dobberpuhl ............... | 307/451 X |
| 5,223,751 | 6/1993 | Simmons et al. .......... | 307/451 X |

Primary Examiner—David R. Hudspeth
Attorney, Agent, or Firm—Blaney Harper; David Aker

[57] ABSTRACT

The interface circuit of the present invention adjusts the signal voltage across a leaking transistor such that the leakage is reduced while also shunting out the adjustment means when the adjustment means impedes the operation of the interface circuit. One embodiment of the present invention is a level translator comprised of a level shifting stage coupled to a buffer stage. The level shifting stage has its power source coupled to a current shunting device. The current shunting device is connected in parallel across the first P-channel device of the level shifting stage. The first P-channel device of the level shifting stage is connected in series with a second P-channel device having its drain connected to a drain of a first N-channel device wherein the first N-channel device has its source connected to a drain of a second N-channel device. The current shunting device is formed from a single P-channel device. The connection between the drains of the second P-channel and the first N-channel device of the level shifting stage is an input to an inverter, which in turn, has its output connected to the input of the current shunting device. When the input to the level shift stage is at the high voltage logic signal level, the input to the inverter is low and the output of the inverter is at a high voltage logic signal level. The high voltage logic signal level then turns off the P-channel device of the current shunting device. The first P-channel device of the level shifting stage has its gate connected to its drain which reduces leakage current in the level shifting stage and reduces the power consumed by the interface circuit when the current shunting device is turned off. When the input to the level shift stage is at the low voltage logic signal level, the input to the inverter is high and the output of the inverter is at a low voltage logic signal level. The low voltage logic signal level allows the current shunting device to directly supply current to the second P-channel device of the level shifting stage and shunts out the first P-channel device. Therefore, the shunted out device does not interfere with the performance of the level shift stage of the interface circuit.

13 Claims, 6 Drawing Sheets

LOW POWER INTERFACE CIRCUIT

FIELD OF INVENTION

This invention relates generally to the field of integrated circuits. In particular, this invention relates to low power CMOS integrated circuits. More specifically, this invention relates to a CMOS integrated circuit interface between low power and high power integrated circuits.

BACKGROUND OF THE INVENTION

The field of integrated circuitry is a rapidly developing field of technology. The number of integrated circuits per unit of surface area of a substrate on which the integrated circuits are built, referred to as integrated circuit density, is continually increasing. The highest integrated circuit density is achieved using Field Effect Transistors (FETs). An FET is a device having a source, gate, and drain arranged such that when a high logic signal voltage is applied to the gate, current may pass from the source to the drain. Similarly, the FET does not allow current to pass between the source and the drain when a low logic signal is applied to the gate. When the integrated circuit density increases, the amount of power dissipated by the large number of integrated circuits on the substrate is increased. The amount of power dissipation is important because complicated heat sinks and circuit packaging may be required to prevent the chip temperature from rising above a value at which the chip was designed to operate. In addition, many electronic devices containing integrated circuits operate on stored power. For example, portable computers often operate on battery power. When power dissipation increases, the faster the battery wears down and the shorter the usefulness of the electronic device. Therefore, reducing power consumption is important for the design of integrated circuits.

One way to decrease the power consumption per unit area of substrate of the integrated circuit is to reduce the voltage at which the circuits operate. However, decreasing the voltage level at which circuits operate creates a compatibility problem because some integrated circuits are designed to operate at set voltage levels. For example, some circuits with which the low voltage circuits must interact, must operate at high voltage levels in order to operate electromechanical devices. Also, there are many integrated circuits in existence which cannot change or lower their operating voltage and the new lower voltage circuits must interact with them as well. Therefore, in order to lower the voltage of new integrated circuits to dissipate less power, some form of interface circuit must be developed so that the low voltage and low power circuits can interact with the higher voltage circuits.

In general, the prior art has provided a variety of interface circuits for translating lower voltage levels into higher voltage logic levels and vice versa. This is because integrated circuits implementing logic functions have been generally decreasing the logic voltage levels over the history of integrated circuit development. For example, many circuits exist for translating 12 volt logic signals into logic signals compatible with 5 volt logic technology. Transistor to Transistor Logic (TTL) standards exist for the purpose of allowing interfacing of circuits having different logic voltage levels. However, these TTL standards generally only work for circuits using a power supply voltage of 3.3 volts or more. Circuits using such a power supply voltage have a logic signal swing high enough so that the FET logic state for any transistor is well defined.

Leading edge technology requires an interface circuit which translates lower voltage logic levels, such as 2.4 volts, into 3.3 volt logic levels. The 2.4 volt logic levels, which for example are associated with powering an integrated circuit chip from two rechargeable 1.2 volt batteries, are low enough so that individual transistors within an integrated circuit may need to be optimized to work well at the lower voltage. Typically, transistors designed to work with the lower voltages have a lower value of threshold voltage at which the transistor turns on. However, this means that these transistors turn on more easily or are more leaky, especially when interacting with 3.3 volt logic circuitry. This poorly defined FET logic state results in increased power consumption because current is flowing in the FET devices when the design of the circuit calls for current not to be flowing in the FET devices.

FIG. 1 illustrates an example of this prior art problem. FIG. 1 illustrates a prior art voltage interface circuit for translating a 2.4 volt logic level into a 3.3 volt logic level. The low voltage logic 5 has an output 7 which has a high (or 1) logic voltage level of 2.4 volts. The output 7 of the low voltage logic 5 is the input into the gates of transistors 10 and 30 which are part of the interface circuit. Transistor 30 is an N-channel device which turns on (allows current to flow) when the gate voltage is high and transistor 10 is a P-channel device which turns off when the gate voltage is high. When the output 7 of the low voltage logic is high, the input voltage to the gate of transistor 70 (P-channel) is low. In this state, an electrical connection is made between the 3.3 volt power supply and the output of the interface circuit 80 through the P-channel transistors 60 and 70. As a result, the output of the interface circuit 80 rises to a high voltage level. Similarly, when the output 7 of the low voltage logic is low, the gate voltage of N-channel transistor 40 is high, and the interface circuit output 80 is connected to ground and is at a low voltage level.

In this application, the transistors of the interface circuit have been optimized to work with a 2.4 volt power supply. They are made in the same integrated circuit technology as the low voltage circuits, except they are powered with a higher voltage power supply. It is desirable to avoid reliability hazards associated with applying a relatively high voltage to low voltage transistors by limiting the voltage level on these devices to 2.4 volts or less from the gate to source or drain to source. Therefore, transistor 20 is inserted in series with transistors 10 and 30 to act as a diode designed to have a voltage drop of about (3.3−2.4)=0.9 volts when conducting current. This level shifting transistor 20 will limit the voltage swing applied to the gates of transistors 70 and 40 as well as limiting the drain to source voltage of transistors 10 and 30 to approximately 2.4 volts. Similarly, transistors 50 and 60 prevent the full 3.3 volt swing on output 80 from appearing directly across transistors 40 and 70 respectively.

A problem with this interface circuit is that when the output 7 of the low voltage logic is high, the transistor 10 does not completely turn off. This is because the transistor 10 was fabricated on the basis of a 2.4 volt logic device and will have a relatively low threshold voltage magnitude (approximately 0.5 volts) whereas the applied gate to source voltage magnitude is approximately (3.3−2.4)=0.9, in this case. When the transistor 10 does not completely turn off, leakage current flows through transistor 10 and unnecessarily dissipates power. When too much current flows through transistor 10, the logic state of the signal driving gates 40 and 70 will be affected so that those devices are not fully switched off and on respectively. One solution to such a problem might be to change the device characteristics of the P channel transistor 10 such that the transistor turns off at the lower voltage signal level. The problem with this solution is that adjusting device characteristics typically requires a process change which is expensive and requires a long lead time. A similar prior art solution which has similar problems is to use a different type of device, such as a JFET, in place of transistor 10. The leakage problem might also arise even if the low voltage and high voltage device characteristics were identical when the tolerance on the logic input voltage is sufficient to affect the operation of the transistors. In this situation, process changes are not effective in fixing the leakage problem.

OBJECTS OF THE INVENTION

It is an object of the present invention to manufacture an improved interface circuit for translating between different voltage levels.

It is another object of the present invention to manufacture an improved interface circuit for translating between low voltage logic and higher voltage logic without altering the device characteristics of the transistor devices associated with the lower and higher voltage logic respectively.

It is a further object of the present invention to manufacture an improved interface circuit for translating between different voltage levels which consumes less power than conventional interface circuits.

It is still another object of the present invention to manufacture an improved interface circuit for translating logic signals into signals useful for low voltage logic devices while reducing the consumption of power in the interface circuit.

It is still a further object of the present invention to manufacture an improved low power interface circuit for translating logic signals into signals useful for low voltage logic without decreasing the performance of the interface circuit.

It is still another object of the present invention to manufacture an improved low power interface circuit for translating low voltage logic signals into signals useful for higher voltage logic devices without decreasing the performance of the interface circuit.

SUMMARY

The interface circuit of the present invention adjusts the signal voltage across a leaking transistor such that the leakage is reduced while also shunting out the adjustment means when the adjustment means impedes the operation of the interface circuit. One embodiment of the present invention is a level translator comprised of a level shifting stage coupled to a buffer stage. The level shifting stage has its power source coupled to a current shunting device. The current shunting device is connected in parallel across the first P-channel device of the level shifting stage. The first P-channel device of the level shifting stage is connected in series with a second P-channel device having its drain connected to a drain of a first N-channel device wherein the first N-channel device has its source connected to a drain of a second N-channel device. The current shunting device is formed from a single P-channel device. The connection between the drains of the second P-channel and the first N-channel device of the level shifting stage is an input to an inverter, which in turn, has its output connected to the input of the current shunting device. When the input to the level shift stage is at the high voltage logic signal level, the input to the inverter is low and the output of the inverter is at a high voltage logic signal level. The high voltage logic signal level then turns off the P-channel device of the current shunting device. The first P-channel device of the level shifting stage has its gate connected to its drain which reduces leakage current in the level shifting stage and reduces the power consumed by the interface circuit when the current shunting device is turned off. When the input to the level shift stage is at the low voltage logic signal level, the input to the inverter is high and the output of the inverter is at a low voltage logic signal level. The low voltage logic signal level allows the current shunting device to directly supply current to the second P-channel device of the level shifting stage and shunts out the first P-channel device. Therefore, the shunted out device does not interfere with the performance of the level shift stage of the interface circuit.

DESCRIPTION OF THE PREFERRED EMBODIMENT

Figure 1:
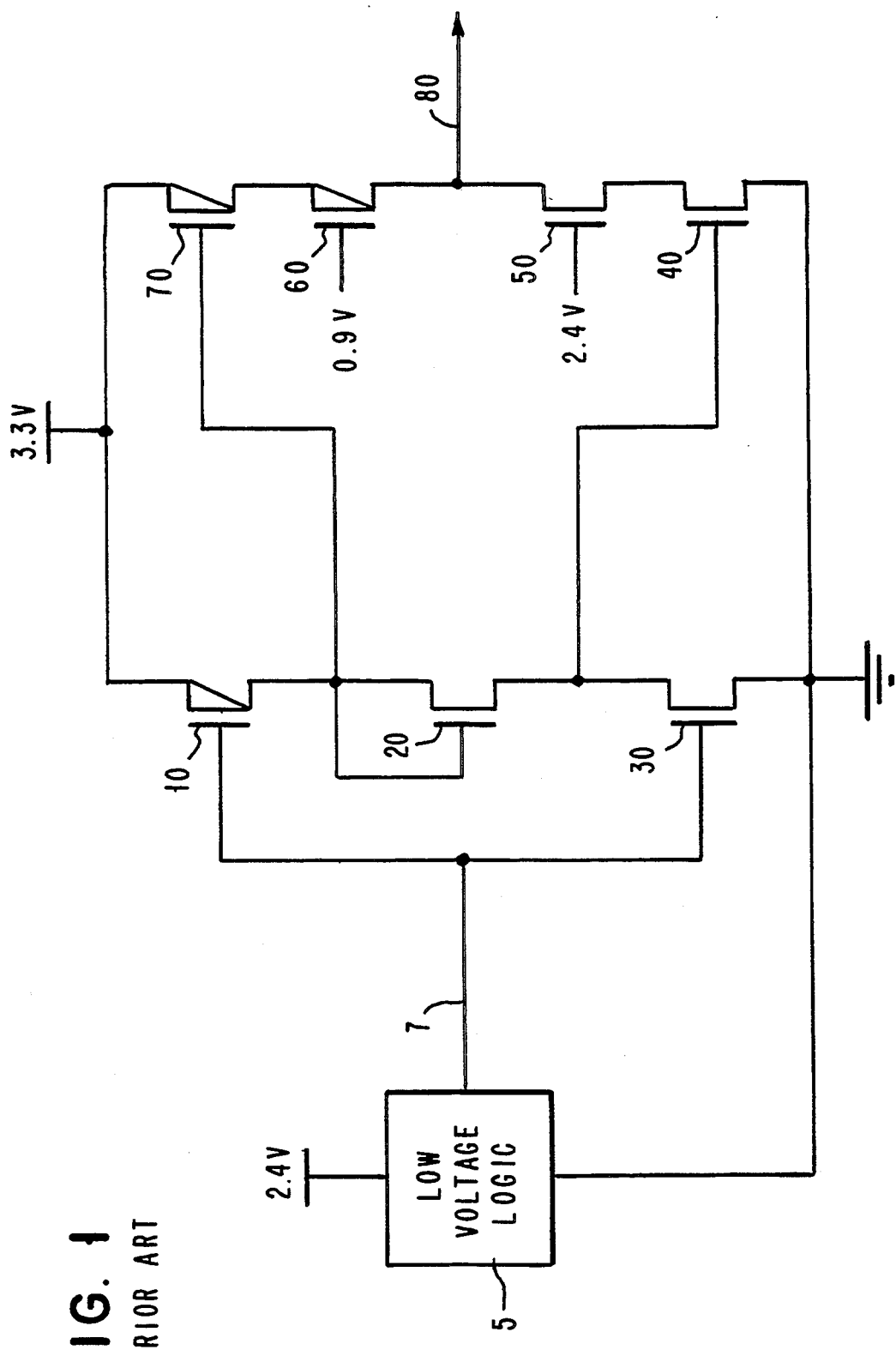
FIG. 1 illustrates a prior art circuit diagram of an interface circuit.
Figure 2:
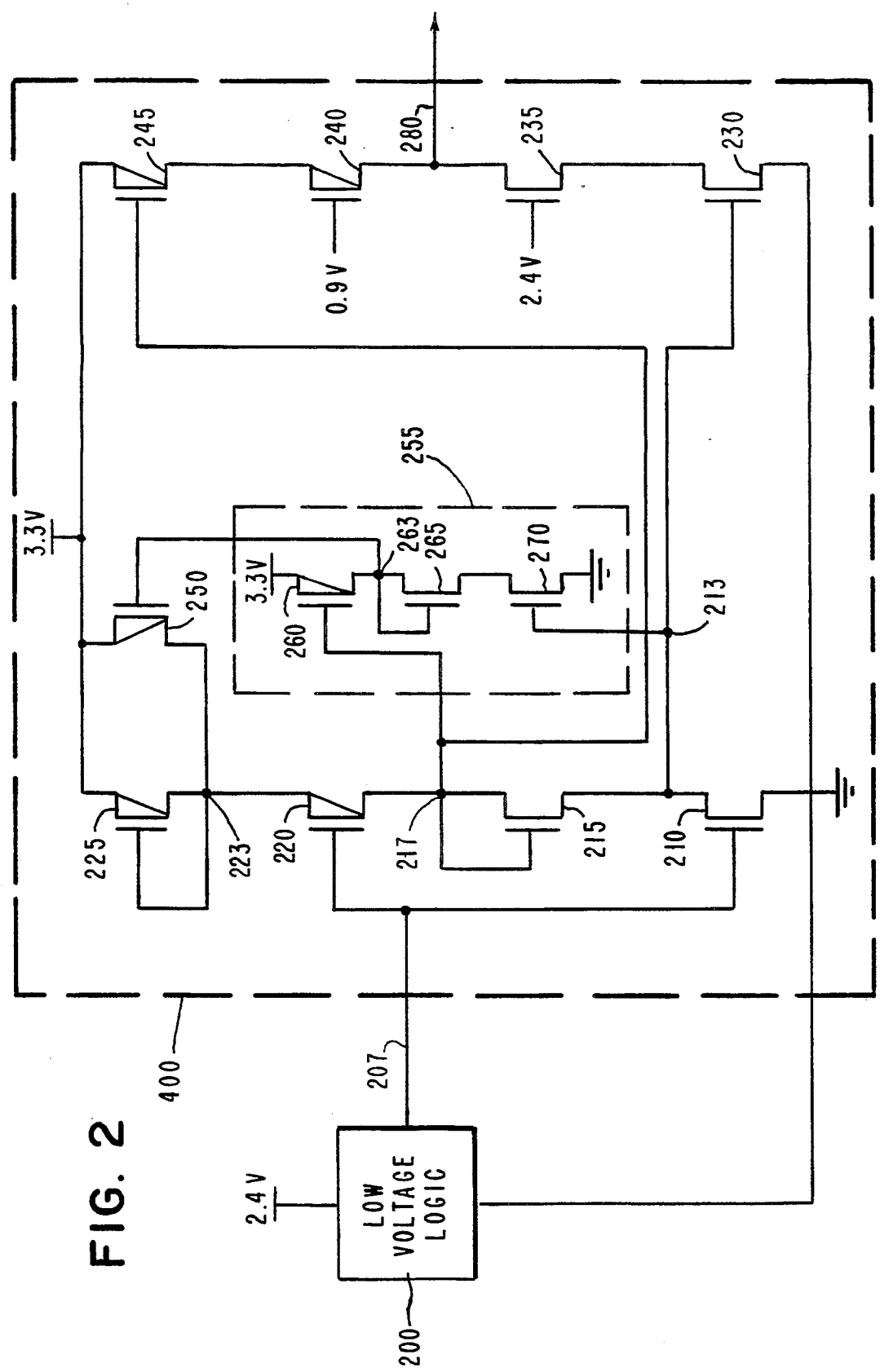
FIG. 2 illustrates an embodiment of an improved interface circuit according to the present invention.

FIG. 2 illustrates one embodiment of an interface circuit according to the present invention. The low voltage logic 200 has a 2.4 volt power supply. The output 207 of the logic 200 is the input into the interface circuit 400. The interface circuit 400 includes a level shift stage and a buffer stage. The level shift stage comprises a first P-channel (PFET) device 220, a second PFET device 225, a first N-channel (NFET) device 210, a second NFET device 215, an inverter 255, and a third PFET device 250. The inverter 255 is formed from PFET transistor 260 and NFET transistors 265 and 270. The output 207 of the low voltage logic is connected to the gate of NFET transistor 210 which has its source connected to ground and its drain connected to the source of a second NFET transistor 215. The gate of the second NFET transistor 215 is connected to its drain and to an input of the inverter 255. The drain of the first PFET transistor 220 is connected to the drain of transistor 215 and the gate of transistor 220 is connected to the output 207. The source of transistor 220 is connected to the drain and gate of the second PFET transistor 225 which has its source connected to the 3.3 volt power supply of the high voltage logic. The second PFET transistor 225 is connected in parallel to a third PFET transistor 250 whose gate is connected to the output of inverter 255.

The input of the inverter is also connected to one input of the buffer stage. Transistor 245 is a PFET device having a source connected to the 3.3 volt power supply, a drain connected to the source of transistor 240, and a gate connected to the input of inverter 255. Transistor 240 is also a PFET device and has its gate connected to a constant voltage supply having a value approximately 0.9 volts. The 0.9 volt supply can be developed from the 3.3 volt power supply by a conventional voltage divider circuit, such as a resistor network. The drain of transistor 240 is connected to the drain of NFET device 235 which has its gate connected to a constant voltage supply of approximately 2.4 volts. The 2.4 volt supply can also be obtained from the voltage divider circuit which generates the 0.9 volt supply. The 2.4 volt supply could also be supplied from the power supply of the low voltage logic 200. The source of transistor 235 is connected to the drain of NFET transistor 230 which has its source connected to ground. The gate of transistor 230 is the second input to the buffer stage and is connected to the drain of transistor 210 in the level shift stage. The output 280 of the interface circuit 400 is the connection between the drain of transistor 240 and the drain of transistor 235.

When the output 207 of low voltage logic 200 has a high voltage level, the additional PFET 225 in series between the source of PFET 220 and the power supply reduces leakage current in the interface circuit 400. This effect can be illustrated by recognizing that the gate to source voltage (Vgs) of transistor 220 is 2.4 volts (high logic level) minus the power supply voltage of 3.3 volts minus the voltage drop across the drain to source (Vds) of transistor 225. For this signal condition, the magnitude of Vgs of transistor 220 is reduced by the magnitude of Vds of transistor 225. Transistor 225 is weakly turned on in this configuration because the Vgs is equal to Vds. Transistor 250, which is in parallel with transistor 225, is turned off at this time because the output of inverter 255 is at a high voltage level which turns off current through PFET 250. As a result, the leakage current through transistors 220 and 225 must be the same which drives the Vgs of transistor 220 to about the same level as the Vgs of transistor 225. This is because both transistors 220 and 225 are in a pinched off conduction condition. The Vgs of both transistors 220 and 225 becomes (2.4−3.3)/2=−0.45. Therefore, both transistors are substantially turned off, and leakage current is reduced in the interface circuit 400 because −0.45 volts is near the threshold voltage of transistors 220 and 225 which are fabricated in a low voltage technology.

Although transistor 225 reduces power consumption in the level translator circuit 400 by reducing leakage current through transistor 220 when the output 207 is high, transistor 225 also tends to lower the input level to the buffer stage of the interface circuit 400 when the output 207 is low. Inverter 255 and transistor 250 compensate for this parasitic effect. In particular, when output 207 is low, the input to inverter 255 is high, and the corresponding output of the inverter is low. P-channel 250 conducts current in this state and shorts out transistor 225 which allows the voltage at the source of transistor 220 to rise to the power supply of the interface circuit 400 (3.3 volts in this embodiment). When the voltage at the source of transistor 220 rises to the 3.3 volt high level, transistor 245 in the buffer stage turns of and transistor 230 turns on. The voltages on the gates of transistors 230 and 245 are higher than they would be if transistor 250 did not short out transistor 225. This effect improves the performance of the interface circuit 400. When transistor 245 turns off and transistor 230 turns on, the voltage level on output 280 is low, approximately at ground potential.

FIG. 2 illustrates that the inverter 255 is a series connection of two NFET devices and one PFET device between the interface power supply voltage and ground. There are two inputs to the inverter 255 illustrated in FIG. 2. The gate of the PFET device is a first input to the inverter 255 and is connected to the drain of NFET 215 of the level shift stage of the interface circuit 400. The second input to the inverter 255 is the gate of NFET 270 which is connected to the drain of transistor 210 of the level shift stage. When the input to the level shift stage is high, both inputs to the inverter are low, which drives the output of the inverter 255 (drain of PFET 260) high to approximately the power supply voltage. When the input to the level shift stage is low, the first inverter input (drain of transistor 215) is connected to a high voltage through transistors 220 and 250 and the second input (source of transistor 215) is connected to a high voltage through transistors 220, 250, and 215. The high voltage on the first input turns off transistor 260 and the high voltage on the second input turns on transistor 270 which drives the voltage at the drain of transistor 265 to a low voltage value.

Figure 3:
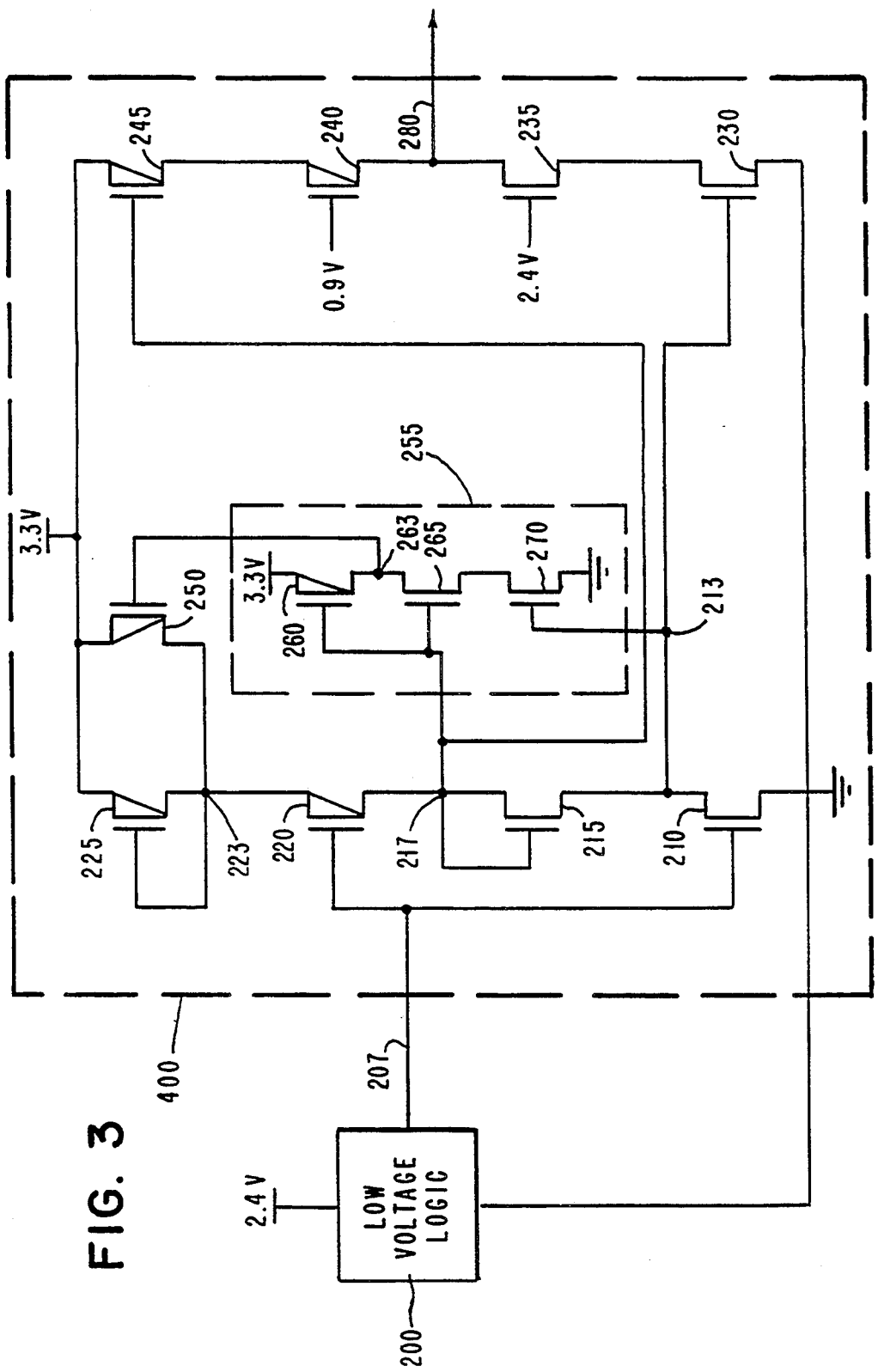
FIG. 3 illustrates an alternate embodiment of an improved interface circuit according to the present invention.

FIG. 3 illustrates an alternate embodiment of an interlace circuit 400 according to the present invention in which the inverter 255 is different from the inverter illustrated in FIG. 2. In particular, the inverter in FIG. 3 has a single input from the level shift stage which is the connection at the drain of transistor 215. This single input is connected to the gates of PFET 260 and NFET 265. The gate of NFET 270 is connected to its drain and functions as a diode between the source of transistor 265 and ground. The function of NFET 270, in this configuration or in the configuration illustrated in FIG. 2, is to limit the voltage drop across transistors 260 and 265. All the transistors which form the interface circuit 400 are made in an integrated circuit technology which is optimized for low voltage operation. Limiting the voltage across certain transistors, such as transistors 260 and 265, ensures the reliability of these transistors. When the input to inverter 255 of FIG. 3 is at a high voltage, transistor 260 is turned off and transistors 265 and 270 are turned on which makes the output voltage of the inverter 255 low. Also, when the input to the inverter 255 is at a low voltage, transistor 260 conducts current and transistor 265 is turned off which makes the output voltage of the inverter high.

The different embodiments of inverter 255 illustrated in FIG. 2 and 3 have in common an NFET with a gate connected to its drain in a current tree containing a PFET. The NFET acts like a diode in this configuration and limits the voltage swing on the output so that it never falls completely to ground potential. This limits the peak magnitude of the gate voltage on transistor 250 as well as limiting the maximum drain to source voltage on the other transistors in the tree so as to avoid hazardous stress conditions on the transistors. In some implementations of this inverter, which depend on specific device design, the PFET device may completely turn off when its input is at a high voltage signal level. In this situation, the NFET connected to act like a diode will not function as a level shifting diode because there is no current flow in the current tree. In order to cure this problem, a bleed resistor having a high value is connected from the source to the drain of the PFET. This bleed resistor has a high enough conductance value such that a small current is allowed to flow through the inverter current tree and make the diode-like NFET operate as a diode, yet the resistor has enough resistance to make the bleed current very small so that power consumption is low.

Figure 4A:
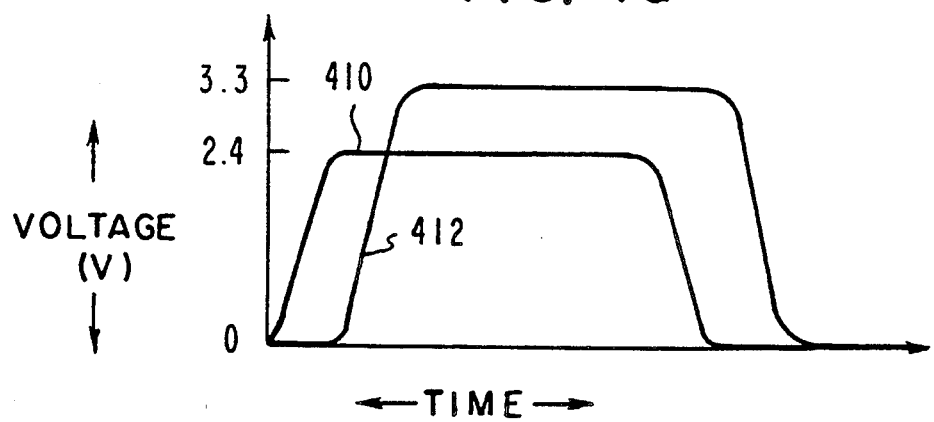
FIG. 4a–4c illustrates input/output characteristics of one interface circuit according to the present invention.
Figure 4B:
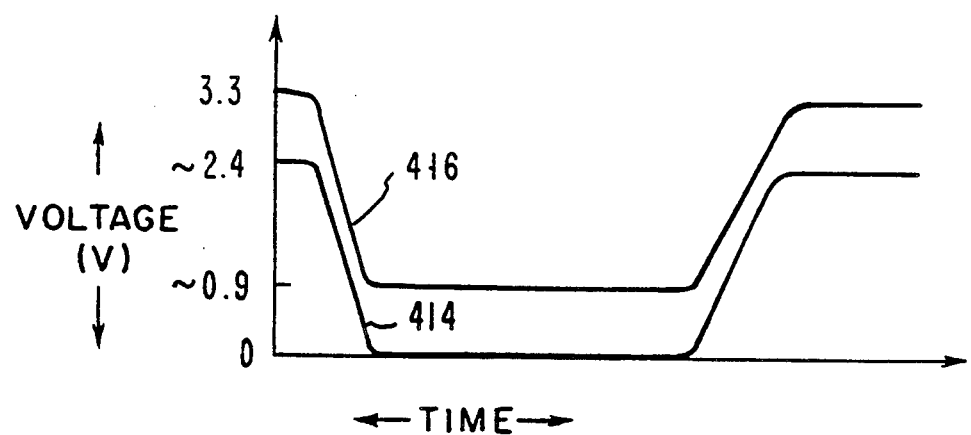
Figure 4C:
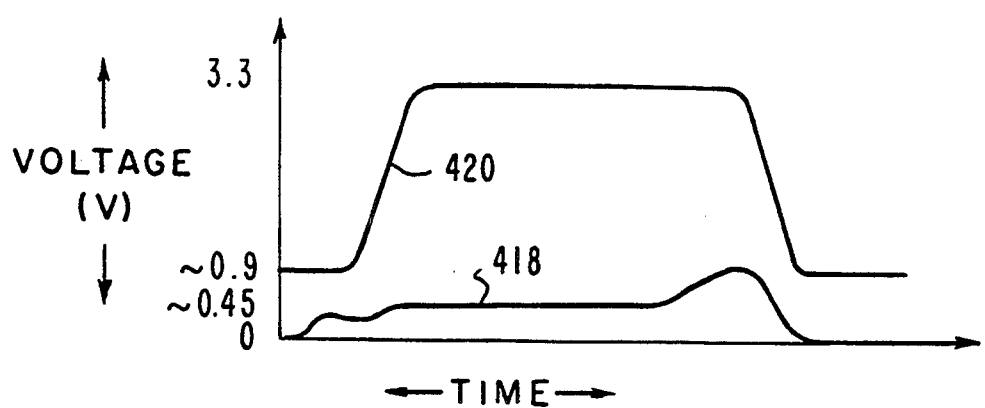

FIG. 4 illustrates the input/output (I/O) characteristics of the level translator circuit 400. FIG. 4(a) illustrates that as the voltage on output 207, represented by curve 410, rises from approximately 0 to 2.4 volts, the voltage on the output 280, represented by curve 412, rises to 3.3 volts. Similarly, the voltage characteristic 414 illustrated in FIG. 4(b) represents the voltage at node 213 of FIG. 2 and characteristic 416 represents the voltage at node 217 of FIG. 2. Also, characteristic 418 illustrated in FIG. 4(c) represents the voltage at node 223 of FIG. 2 and characteristic 420 represents the voltage at node 263 of FIG. 2.

Figure 5:
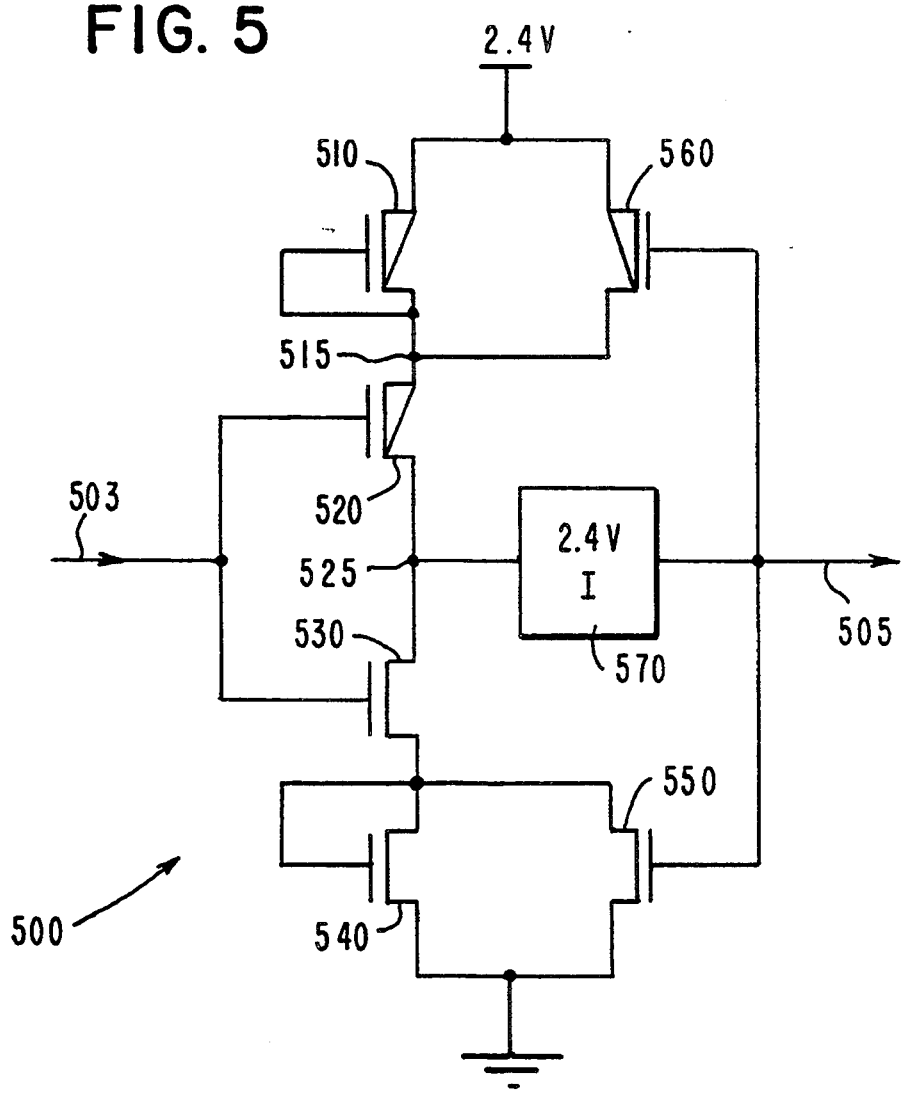
FIG. 5 illustrates an embodiment of an improved receiver circuit according to the present invention.

Level translator circuit 400 is useful for translating the output of low voltage logic into higher voltage logic levels useful by other types of integrated circuits. Low voltage logic must also be able to receive signals from a variety of integrated circuits. In particular, low voltage logic must be able to receive signals from integrated circuits having TTL compatible output voltage levels. TTL compatible integrated circuits have output voltage levels with a low value which may be as high as 0.4 volts, and a high value which may be as low as 2.1 volts. Low voltage receivers subjected to such sustained high and low values consume substantial amounts of power because of leakage current flowing in the receiver circuit. FIG. 5 illustrates a low voltage receiver circuit which reduces such leakage current and power consumption. Receiver circuit 500 comprises PFET transistors 510 and 520 connected in series with NFET transistors 530 and 540, and the series connection of these transistors being connected between a power supply (2.4 volts) and ground. The gate of transistor 510 is connected to its drain. PFET transistor 560 is connected in parallel with PFET 510 having its source connected to the power supply and its drain connected to the source of transistor 520. The input 503 to the receiver circuit 500 is connected to the gates of transistors 520 and 530. The gate of transistor 540 is connected to its drain. N-channel transistor 550 is connected in parallel with transistor 540 having its source connected to ground and its drain connected to the source of transistor 530. The gates of transistors 550 and 560 are connected to the output of an inverter 570 which is also the output 505 of the receiver circuit. The input of the inverter 570 is connected to the drain of transistor 520 and the drain of transistor 530. The inverter 570 is implemented with a power supply equal to the receiver circuit power supply and has a high logic signal voltage level equal to the power supply voltage (2.4 volts in this embodiment).

When a voltage level, representing a high logic signal, is applied to the input 503 of the receiver circuit 500 and that voltage level is sustained below the power supply level (for example, at 2.1 volts), transistor 520 is not completely turned off. The leakage current flowing through transistor 520 is greatly reduced in receiver circuit 500 by inserting transistor 510 in series with transistor 520. The vds voltage drop across transistor 510 reduces the Vgs of transistor 520 and greatly reduces the current leakage through the series connection of transistors 510 and 520. When the logic signal on the input 503 is low, the Vds voltage drop across transistor 510 tends to impede the operation of the receiver circuit by reducing the high logic level driving inverter 570. However, the voltage at the drain connection between transistors 520 and 530 will rise sufficiently to switch the inverter output to a low value which causes transistor 560 to shunt out transistor 510. Shunting out transistor 510 allows the voltage on the drain of transistor 520 to rise to its full value of approximately 2.4 volts in this embodiment, and therefore, completely switches inverter 570 so that it does not have a substantial leakage current in its P-channel device.

A similar leakage problem, to the problem associated with transistor 520, occurs with transistor 530. When the voltage applied to input 503 representing a low logic signal is sustained above ground (at for example 0.4 volts), transistor 530 conducts leakage current. The Vds voltage drop across transistor 540 in series with transistor 530 reduces the leakage current by reducing the Vgs of transistor 530 in a similar manner as illustrated above. This reduction in leakage current reduces the power consumption of the receiver circuit 500. Although the leakage current is reduced, transistor 530 impedes the receiver operation when the logic level on the input 503 is high. Transistor 550 is placed in parallel with transistor 540 to short out transistor 540 when the voltage level on the input 503 is high. As a result, when voltage signals on the input 503 are sustained at low values above ground or high values below the power supply, the receiver circuit 500 reduces leakage current and reduces power consumption without seriously impeding the speed of the receiver operation. Also, the addition of transistors 510 and 540 in a fashion controlled by the output voltage (which is representative of the previous input voltage) shifts the switching point of the receiver circuit so that it acts as a hysteresis receiver. That is, a signal rising from near ground toward a high level must rise sufficiently high enough (for example appreciably higher than (2.4/2)=1.2 volts in this case) to overcome the effect of transistor 540 reducing the current in transistor 530. Similarly, a falling signal must fall sufficiently far (appreciably below 1.2 volts) before the receiver output switches. This effect can be useful in suppressing false switching by noise on the input 503.

In this embodiment as a receiver of standard TTL level signals, it is desirable to limit the maximum voltage swing on input 503. Such limitation is accomplished by, for example, passing the input signal through an N-channel transistor with its gate tied to a moderately high potential (for example 3.3 volts). The present invention is also useful in other types of reduced swing signals. In particular, the present invention is useful as a receiver of signals from CMOS drivers terminated with resistors to match transmission line impedances. These types of CMOS drivers typically have a reduced signal swing which will cause leakage current in a conventional CMOS receiver and that problem is corrected through the use of the present invention.

Figure 6:
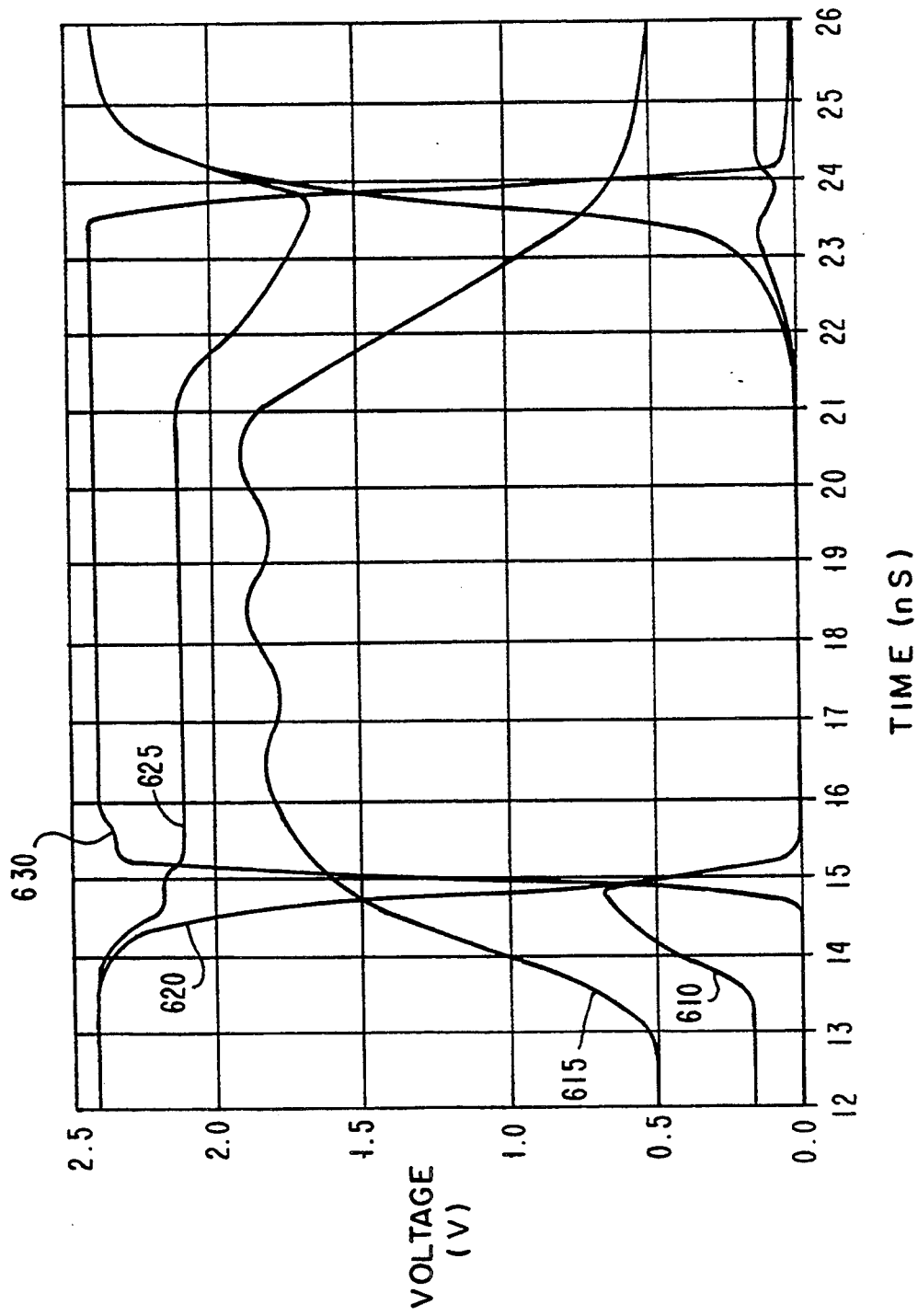
FIG. 6 illustrates input/output characteristics of one receiver circuit according to the present invention.

FIG. 6 illustrates simulations of the input/output characteristics of the receiver circuit 500. In particular, characteristic 610 represents the voltage at node 535 of FIG. 5, characteristic 615 represents the input signal voltage at input 503, characteristic 620 represents the voltage at node 525, characteristic 625 represents the voltage at node 515, and characteristic 630 represents the output signal voltage at the output 505. The simulations were performed using a channel length of 0.25 microns and the W/L ratios of the devices generating these voltage characteristics are:

| Transistor | W/L |
|---|---|
| 510 | 100 |
| 560 | 20 |
| 520 | 60 |
| 530 | 30 |
| 540 | 50 |
| 550 | 10 |

The input signal to the receiver 500 having a low level of approximately 0.5 volts and a high level of approximately 1.8 volts corresponds to an output signal of the receiver 500 having a low level of approximately 0.0 volts and a high voltage level of approximately 2.4 volts.

While the invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

We claim:

1. An interface circuit for transmitting logic signals, comprising:
   a parallel connection of first and second PFET devices, said first PFET device having its gate connected to its drain;
   said first and second PFET devices connected in series with an input means, said input means receiving logic signals, inverting said logic signals, and coupling said inverted logic signals to an inverter, said series connection of said input means and said PFET devices being coupled between a first power supply connection and a ground connection; and
   said inverter reinverting said inverted logic signals and coupling said reinverted logic signals to a gate of said second PFET device, wherein:
   said inverter comprises a series connection of at least two NFET devices and a PFET device, at least one of said NFET devices having a gate connected to a drain.

2. An interface circuit, as in claim 1, wherein:
   said first PFET device is connected in series with said input device.

3. An interface circuit, as in claim 2, further comprising:
   a logic means for generating logic signals and transmitting said generated logic signals to said input means, said logic means coupled to a second power supply connection having a supply voltage lower than a supply voltage of said first power supply connection.

4. An interface circuit, as in claim 3, further comprising:
   a buffer stage coupled to said input means, said buffer stage transmits logic signals corresponding to said generated logic signals.

5. An interface circuit for transmitting logic signals generated from logic circuits having a low voltage power supply, comprising:
   a first PFET device having a drain connected to a drain and a gate of a first NFET device, a source connected to a drain and a gate of a second PFET device, and a gate connected to said logic circuits having a low voltage power supply;
   said second PFET device having source connected to a high voltage power supply, said high voltage power supply having a higher voltage than said low voltage power supply;
   said first NFET having a source connected to a drain of a second NFET device, said second NFET device having a source connected to a ground connection and a gate connected to said first PFET gate; and
   said first PFET having a drain connected to an inverter, said inverter connected between said first PFET drain and a gate of a third PFET, said third PFET having a source connected to said second PFET source and a drain connected to said second PFET drain.

6. An interface circuit, as in claim 5, wherein:
   said inverter comprises a series connection of at least two NFET devices and a PFET device, at least one of said NFET devices having a gate connected to a drain.

7. An interface circuit, as in claim 5, further comprising:
   a fourth PFET having a source connected to said second PFET source, a gate connected to said first PFET drain, and a drain connected to a source of a fifth PFET;
   said fifth PFET having a gate connected to a first voltage reference, and a drain connected to a drain of a third NFET, said third NFET having a gate connected to a second voltage reference and a source connected to a drain of a fourth NFET; and
   said fourth NFET having a source connected to said ground connection and a gate connected to said first NFET source.

8. An interface circuit, as in claim 7, wherein:
   said first voltage reference supplies a voltage of approximately the difference between said high voltage and said low voltage power supplies to said fifth PFET gate, and said second voltage reference supplies a voltage of approximately said low voltage power supply to said third NFET gate.

9. An interface circuit, as in claim 8, wherein: said inverter comprises a series connection of at least two NFET devices and a PFET device, at least one of said NFET devices having a gate connected to a drain.

10. A low voltage receiver, comprising:
    an input means for receiving logic signals connected in series between a parallel connection of first and second PFET devices and a parallel connection of first and second NFET devices, said first PFET having a gate connected to a drain, said first PFET drain being connected to said input means, said first NFET device having a gate connected to a drain, and said first NFET drain being connected to said input means; and
    said input means having an output coupled to an inverter, and said inverter having an output coupled to a gate of said second PFET and a gate of said second NFET.

11. A low voltage receiver, as in claim 10, wherein:
    said input means inverts said logic signals and transmits said inverted logic signals to said inverter; and
    said inverter reinverts said inverted logic signals and transmits said reinverted logic signals to said second PFET gate and to said second NFET gate.

12. A low voltage receiver, as in claim 10, wherein:

said input mean comprises a PFET device connected in series to an NFET device, said input means PFET and NFET devices having a common gate connection for receiving logic signals and a common drain connection which forms the output of said input means.

13. A low voltage receiver, as in claim 12, wherein: said inverter comprises a series connection of at least one NFET device and a PFET device.

* * * * *